United States Patent
Bohnert et al.

(10) Patent No.: US 6,734,657 B2
(45) Date of Patent: May 11, 2004

(54) TEMPERATURE-COMPENSATED FIBER OPTIC CURRENT SENSOR

(75) Inventors: Klaus Bohnert, Oberrohrdorf (CH); Jürgen Nehring, Wettingen (CH)

(73) Assignee: ABB Research LTD, Zurich (CH)

(*) Notice: Subject to any disclaimer, the term of this patent is extended or adjusted under 35 U.S.C. 154(b) by 0 days.

(21) Appl. No.: 09/754,116

(22) Filed: Jan. 5, 2001

(65) Prior Publication Data

US 2001/0050551 A1 Dec. 13, 2001

(30) Foreign Application Priority Data

Jan. 5, 2000 (DE) ......................................... 100 00 306

(51) Int. Cl.$^7$ .............................................. G01R 31/00
(52) U.S. Cl. ....................................................... 324/96
(58) Field of Search ............................... 324/96, 158.1, 324/750, 751, 752, 244.1; 356/477, 483, 487, 346; 335/496; 385/12, 2

(56) References Cited

U.S. PATENT DOCUMENTS

| | | | |
|---|---|---|---|
| 4,581,579 A | 4/1986 | Nagatsuma et al. | |
| 4,584,470 A | 4/1986 | Iizuka et al. | |
| 5,270,791 A | 12/1993 | Lefevre et al. | |
| 5,537,209 A | * 7/1996 | Lis ............................ | 356/487 |
| 5,696,858 A | * 12/1997 | Blake ......................... | 385/12 |
| 5,764,046 A | 6/1998 | Bosselmann | |
| 5,953,121 A | * 9/1999 | Bohnert et al. .............. | 356/345 |
| 6,281,672 B1 | * 8/2001 | Terai et al. ................... | 324/96 |

FOREIGN PATENT DOCUMENTS

| | | |
|---|---|---|
| DE | 3132414 A1 | 2/1983 |
| DE | 3326736 C2 | 2/1984 |
| DE | 4224190 A1 | 1/1994 |
| DE | 19506169 A1 | 8/1996 |
| DE | 19703128 A1 | 8/1998 |
| DE | 19808517 A1 | 9/1999 |
| EP | 0856737 A1 | 8/1998 |
| WO | WO98/58268 | 12/1998 |

OTHER PUBLICATIONS

"In–Line Sagnac Interferometer Current Sensor", Blake, et al., IEE Transactions on Power Delivery, vol. 11, No. 1, Jan. 1996, pp. 116–121.

"Faseroptische Sensoren", R. Stierlin, Optoelektronik Bulletin SEV/VSE 82, Jan. 1991, pp. 21–29.

* cited by examiner

*Primary Examiner*—Vinh P. Nguyen
(74) *Attorney, Agent, or Firm*—Burns, Doane, Swecker & Mathis, L.L.P.

(57) ABSTRACT

In a fiber optic current sensor having a coiled sensor fiber (1) which encloses a current conductor (S), and at least one phase delay element (4, 5) adjoining the sensor fiber (1), the at least one phase delay element (4, 5) has a phase delay with a temperature dependence such that it at least approximately compensates for a temperature dependence of a Verdet's constant (V) of the sensor fiber (1). It is thereby possible to achieve an at least approximately temperature-independent sensor signal.

11 Claims, 2 Drawing Sheets

TEMPERATURE-COMPENSATED FIBER OPTIC CURRENT SENSOR

TECHNICAL FIELD

The present invention relates to a fiber optic current sensor in accordance with the preamble of patent claim 1.

PRIOR ART

A fiber optic current sensor of the generic type is known from EP-A-0,856,737. It has a magneto-optically active sensor fiber which is wound in a coil and encloses a current conductor. The sensor fiber is connected, at least at one end, via a phase delay element to a further optical fiber, a so-called feed or return fiber, via which light can be coupled into or out of the sensor fiber. The sensor fiber is typically fabricated from quartz glass and has a round core cross section. Circularly polarized light propagates in the sensor fiber. The feed and return fibers preferably have an elliptical core cross section and propagate linearly polarized light. Acting as phase delay element is a birefringent fiber segment which is arranged between the sensor fiber and feed fiber. The fiber segment has main optical axes which are aligned at 45° to the main axes of the feed and return fibers. Its length is usually selected such that it acts as a $\lambda/4$ phase delay element. It thereby converts linearly polarized light of the feed and return fibers into circularly polarized light which propagates in the sensor fiber.

The sensor fiber is operated either as a Sagnac interferometer or, when one of its ends is silvered, as reflection interferometer. In both cases, two circularly polarized optical waves propagate in the sensor fiber. Here, the waves are oppositely directed in the case of the Sagnac interferometer, and run in the same direction in the case of the reflection interferometer. Both waves have the same sense of polarization in the Sagnac interferometer, being either left-circularly or right-circularly polarized. They have an opposite sense of polarization in the reflection interferometer.

If current is flowing through the current conductor, the current generates a magnetic field which leads to a differential phase shift between these two oppositely directed or identically directed optical waves. This effect is termed the magneto-optic or Faraday effect. The phase shift produced is proportional in this case to the current, and amounts in the Sagnac configuration to $$\Delta\Phi_S = 2VNI \quad (1)$$

and in the reflection configuration to $$\Delta\Phi_R = 4VNI \quad (2)$$

V denoting the Verdet's constant of the fiber, N the number of fiber windings in the coil, and I the current intensity.

The sensor fiber described in EP-A-0,856,737 is certainly free from mechanical stresses, and so the sensor signal obtained is not disturbed by a temperature-dependent, stress-induced linear birefringence. However, the Verdet's constant V likewise exhibits a temperature dependence which is noticeable even in the case of an ideal, stress-free fiber coil. Thus in the case of a quartz fiber the temperature dependence per ° C. is approximately $0.7 \times 10^{-4}$. The sensor signal therefore changes by 0.7% given the temperature fluctuation by 100° C. However, for applications of the current sensor in high-voltage installations there is frequently a need for substantially higher accuracy of current measurement. Typical values are ±0.2% in the temperature range from −40° C. to +85° C.

SUMMARY OF THE INVENTION

It is therefore the object of the invention to create a fiber optic current sensor of the type mentioned at the beginning which exhibits an improved temperature compensation.

This object is achieved by a current sensor having the features of patent claim 1.

According to the invention, the current sensor has at least one phase delay element with a temperature dependence which at least approximately compensates for a temperature dependence of a Verdet's constant of a sensor fiber.

The compensation comes about by virtue of the fact that the phase delay element has an appropriate phase delay angle which deviates from a phase delay angle of an ideal phase delay element. In this case, it is selected to be larger or smaller as a function of a sign of its temperature dependence than that of the ideal phase delay element, for example as a 90° phase delay angle of an ideal $\lambda/4$ segment.

Moreover, in the case of a Sagnac interferometer, the phase delay angle is selected as a function of a relative alignment of fast axes of the phase delay element to one another.

The phase delay element is preferably a birefringent fiber segment with an elliptical core cross section, it being possible to set the phase delay angle by selecting the length of the segment.

Further advantageous embodiments follow from the dependent patent claims.

BRIEF DESCRIPTION OF THE DRAWINGS

The subject matter of the invention is explained in more detail below with the aid of preferred exemplary embodiments which are illustrated in the attached drawings, in which.

WAYS OF IMPLEMENTING THE INVENTION

Figure 1:
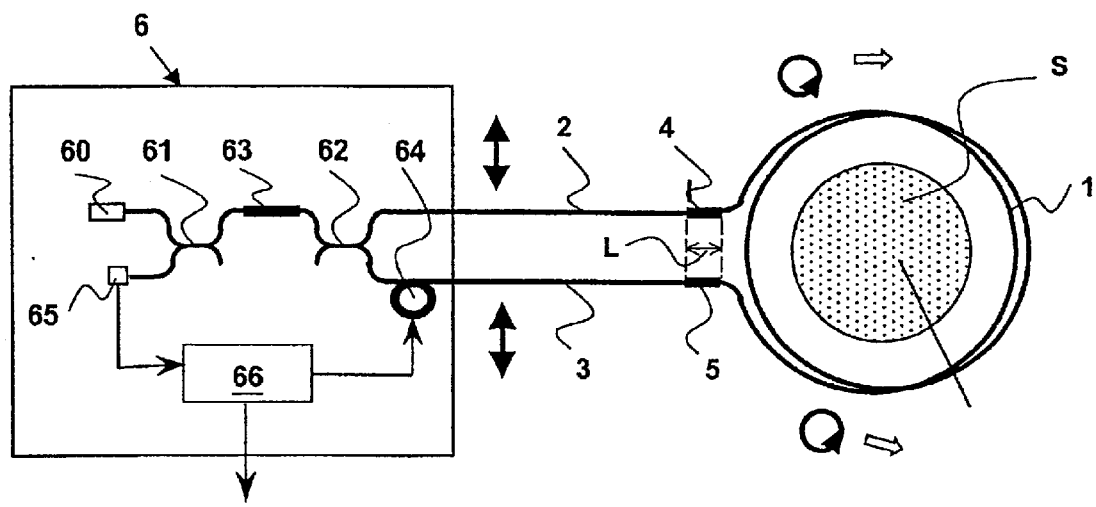
FIG. 1 shows a schematic of a fiber optic current sensor in the form of a Sagnac interferometer.

FIG. 1 shows a fiber optic current sensor in a Sagnac configuration. Its basic design and its mode of operation are known from the prior art cited at the beginning. It will not be examined in detail below.

A sensor fiber 1 with a round core cross section is wound in a coil about a current conductor S. A first end of the sensor fiber 1 is connected to a feed fiber 2, and a second end is connected to a return fiber 3. Feed and return fibers 2, 3 preferably have an elliptical core cross section. The connection of feed and return fibers 2, 3, respectively, to the sensor fiber 1 is performed via in each case at least one, here exactly one phase delay element 4, 5.

In the example illustrated here, the phase delay elements 4, 5 are short segments of a birefringent fiber, preferably with an elliptical core. In this case, the fiber has main optical axes of birefringence which coincide with the main axes of the elliptical core. The core therefore has a long and a short main axis, the short main axis being termed the fast axis.

The feed and return fibers 2, 3 are joined to the phase delay elements 4, 5 such that the short main axes of the fiber cores of the two fibers form a defined deflection angle, preferably of 45°. A linear polarization in the feed fiber, which is aligned parallel either to the long or to the short core axis, is split upon entry into the phase delay element into two orthogonal polarization components which are directed parallel to the main axes of the core of the phase delay element. The two polarization components propagate at different speeds because of the birefringence, the rate of propagation of the component parallel to the fast axis being higher than the other. At the end of the phase delay element, the two polarization components have accumulated a differential phase delay which may be described by a phase delay angle $\phi$. The phase delay angle $\phi$ increases in proportion to the length of the phase delay element. In the case of an ideal $\lambda/4$ segment of zeroth order, the differential delay corresponds to a quarter of the wavelength, and the phase delay angle $\phi$ is 90°. The light emerging from the phase delay element is then circularly polarized. In the case of a $\lambda/4$ segment of higher order, the phase delay angle corresponds to an odd multiple of 90°.

The feed and return fibers 2, 3 are connected to a gyroscopic module 6, which is likewise known. The gyroscopic module 6 has a light source, in particular a laser diode 60, two fiber couplers 61, 62, a fiber polarizer 63, a phase modulator 64, a photodiode 65 and a signal processor 66. An optical wave generated in the laser diode 60 passes via the first fiber coupler 61 into the fiber polarizer 63, is linearly polarized and subsequently decomposed into two component waves in the second fiber coupler 62. The first component wave, which continues to be linearly polarized, passes via the feed fiber 2 to the first phase delay element 4, is converted into circularly polarized light and launched into the sensor fiber 1. Subsequently, it passes via the second phase delay element 5, where it is reconverted into linearly polarized light, and further via the return fiber 3 and the phase modulator 64 back to the second fiber coupler 62. The second component wave traverses the interferometer in the opposite direction. The direction of propagation and polarizations of the two component waves are represented in FIG. 1 with arrows.

Thus, two oppositely directed optical waves propagate in the sensor fiber 1. If current is flowing through the current conductor L, these two waves experience the differential phase shift $\Delta\Phi_S$ proportional to the current which was mentioned at the beginning.

Figure 2:
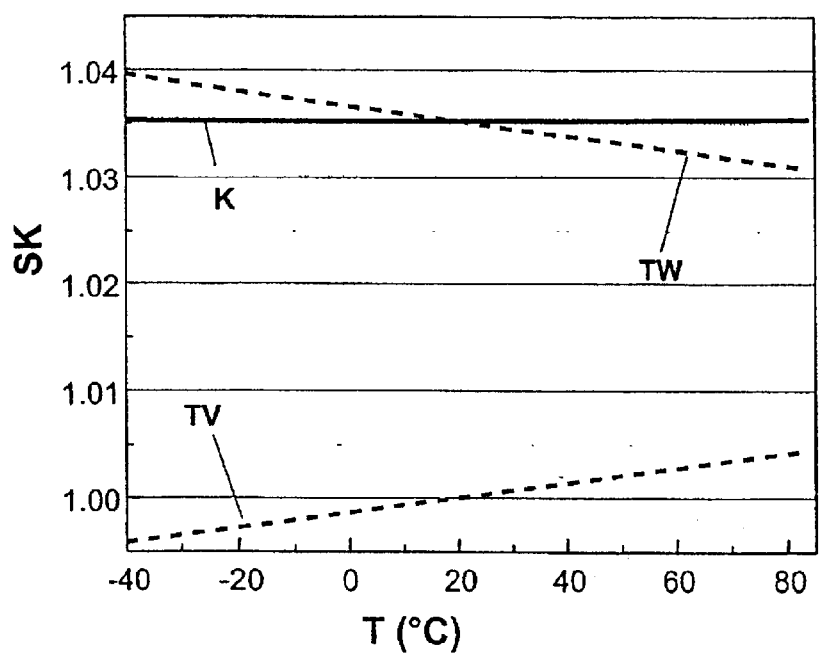
FIG. 2 shows a graph of a normalized scale factor as a function of temperature.

According to the invention, the temperature dependence of phase delay in the phase delay elements 4, 5 is now utilized in order to compensate for the temperature dependence of the Verdet's constant V at least approximately. Such a compensation is illustrated in FIG. 2, a sensitivity of the sensor, called the normalized scale factor SK, being represented as a function of temperature. A virtually temperature-independent scale factor was achieved by selecting a suitable phase delay angle, something which is represented in the function K(T). The function K(T) is the product of the functions TW(T) and TV(T). In this case, TV(T) shows how the scale factor SK changes on the basis of the temperature dependence of the Verdet's constant. TW(T) describes the change in the scale factor SK owing to the temperature-dependent phase delay in the phase delay elements 4, 5. Consequently, according to the invention the temperature dependence of TW(T) is selected such that it at least approximately compensates for that of TV(T). In this case, the normalized scale factor SK is increased or reduced as a side effect.

In a fiber optic phase delay element, the desired phase delay angle can be achieved by selecting the length L of the fiber segment. An ideal $\lambda/4$ segment of zeroth order has a phase delay angle of 90°, the ideal length of the segment being for this a quarter of a beat length of orthogonal polarization modes. In a $\lambda/n$ segment of order m, the ideal length is an m-multiple of 1/n. In the case of a phase delay element temperature-compensated according to the invention, the length L thereof deviates from this ideal length. Which phase delay angle or which length L are, however, suitable for temperature compensation is revealed from the following considerations:

The propagation of the optical waves through the various fiber optic paths of the current sensor can be described by means of the Jones matrices. If the phase delay in the two $\lambda/4$ phase delay elements is exactly 90°, that is to say if the two oppositely directed waves are exactly circularly polarized, the current-induced differential phase shift between the two waves is given by equation (1) in the case of an ideal, temperature-independent fiber coil. If the phase delay in the two phase delay elements deviates from this ideal of phase delay angle of 90°, the current-induced phase shift is $$\Delta\Phi'_S = 2 \arctan[\,\tan(\Delta\Phi_S/2)\cos(\delta_1/2+\delta_2/2)/\cos(\delta_1/2-\delta_2/2)\,] \quad (3)$$

$\Delta\Phi_S$ is given in this case by equation (1). $\delta_1$ and $\delta_2$ relate to the deviation of the differential phase delays $\phi_1$ and $\phi_2$ in the two phase delay elements.

$$\delta_1 = \phi_1 - 90° \quad (4)$$

$$\delta_2 = \phi_2 - 90° \quad (5)$$

Equation (3) holds for the case in which the two phase delay elements 4, 5 each have a fast axis which are orientated at 90° to one another.

For sufficiently small values of $\Delta\Phi$, $\delta_1$ and $\delta_2$, equation (3) can be written to a good approximation as $$\Delta\Phi'_S \approx \Delta\Phi_S[1-(\tfrac{1}{2})\delta_1\delta_2] \quad (6)$$

If the fast axes of the two phase delay elements 4,5 are aligned parallel to one another, equation (6) is replaced by $$\Delta\Phi'_S \approx \Delta\Phi_S[1+(\tfrac{1}{2})\delta_1\delta_2] \quad (7)$$

If the fast axes are at an angle of 45° to one another, it follows that $$\Delta\Phi'_S \approx \Delta\Phi_S[1-(\tfrac{1}{2})\delta_1\delta_2/2)^2] \quad (8)$$

The sensitivity of the current sensor, that is to say its normalized scale factor SK, is described in this case by the ratio $\Delta\Phi'_S/\Delta\Phi_S$.

Figure 3:
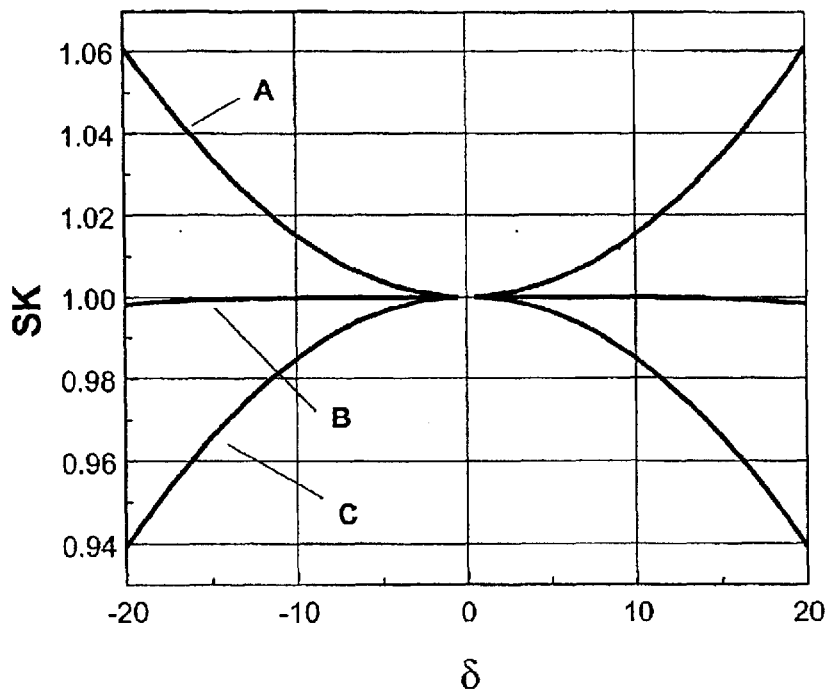
FIG. 3 shows a graph of a normalized scale factor of the sensor in accordance with FIG. 1, as a function of a deviation $\delta$ of a phase delay of a 90° phase delay angle of an ideal $\lambda/4$ segment.

In FIG. 3, the scale factor SK from the three abovenamed different alignments of the fast axes is represented as a function of $\delta$. In this case, $\delta$ is a deviation of the phase delay angle $\phi$ from the phase delay angle of an ideal $\lambda/4$ segment, that is to say from 90° here. In the example illustrated here, the first and second phase delay elements 3, 4 have the same deviation $\delta = \delta_1 = \delta_2$. The curve denoted by A represents the scale factor for fast axes, which are aligned parallel to one another, for the two phase delay elements 3, 4. The curve denoted by B shows the scale factor of a current sensor with two phase delay elements, whose fast axes form an angle of 45°, and in the case of curve C the first axes are aligned orthogonal to one another. Curve B shows a dependence of $\delta$ to the fourth power, whereas curves A and C represent quadratic dependences.

In accordance with FIG. 3, the contribution of the λ/4 segments to the temperature dependence of the scale factor is larger the more the phase delay deviates from 90°. For λ/4 segments of higher order, the temperature dependence increase in proportion to the order in this case. By appropriately selecting the phase delay angle when producing the phase delay elements 4, 5, it is possible to selectively influence their contribution to the temperature dependence of the scale factor SK.

The type of phase delay element is to be taken into account in this case. If optical fibers are used, their temperature dependence depends strongly on the type of fiber. Fibers with stress-induced birefringence, such as a panda fiber or a bow tie fiber, have a markedly higher temperature dependence than fibers with an elliptical core cross section, whose birefringence is determined by geometry. In addition, the phase delay angle is selected as a function of the sign of the temperature dependence.

In the example illustrated here, the aim is to achieve a temperature compensation in the range of −40° C. to +80° C. As already mentioned, the contribution of the Verdet's constant V to the temperature dependence of the current sensor is $0.7 \times 10^{-4}/°$ C., that is to say between −40° C. and +80° C. the sensor signal increases by 0.84% because of this contribution, given a constant current. The contribution of the two phase delay elements 3, 4 should therefore lower the signal by 0.84% over this temperature range. In this case, the type of phase delay elements and the mutual alignment of their fast axes are to be taken into account.

1st Example

In a first example of a current sensor in accordance with FIG. 1, the temperature dependence of the phase delay is −0.0153°/° C., as is typical for a λ/4 segment made from a commercial quartz glass fiber with an elliptical core. Furthermore, the fast axes of the λ/4 segments are orientated at least approximately in parallel. An optimum temperature compensation of the sensor is achieved when the phase delay angle of the λ/4 segments is set in the case of room temperature (20° C.) to at least approximately 150° instead of 90°, as is illustrated in FIG. 2. In the case of a wavelength of 820 nm, the length of the fiber optic phase delay segment is therefore 1.11 mm. An ideal λ/4 segment would have a length of 0.95 mm. The normalized scale factor SK increases from 1 to 1.035.

2nd Example

In a second example, the first axes of the λ/4 segments are orientated not in parallel, but at least approximately orthogonally. An optimum temperature compensation is reached whenever the phase delay angle is set to at least approximately 75°. The length of the fiber optic phase delay segment is 0.79 mm. The normalized scale factor SK decreases to 0.965.

In the case of non-parallel or orthogonal axes of the λ/4 segments, temperature compensation is likewise possible when the relative axial alignment is known. The relationship between $\Delta\Phi'_S$ and δ must be correspondingly calculated for this purpose with the aid of the formalism of the Jones matrices. However, with increasing deviation from the orthogonal or parallel axial orientation, it is necessary, as is clear from FIG. 2, to select a larger deviation in the phase delay of 90° by comparison with a configuration with orthogonal or parallel axes, in order to achieve as complete a temperature compensation as possible.

If use is made of phase delay elements with a greater temperature dependence (for example fiber segments with stress-induced birefringence, a correspondingly smaller deviation in the phase delays of 90° is to be selected for the temperature compensation.

It is also possible in principle to use two λ/4 segments with different phase delays and temperature dependences as long their combined action compensates for the temperature dependence of the Verdet's constant.

Furthermore, it is also possible to use λ/4 plates as phase delay elements instead of the abovedescribed λ/4 segments, the temperature compensation being performed by selecting the appropriate thickness of the plates.

Figure 4:
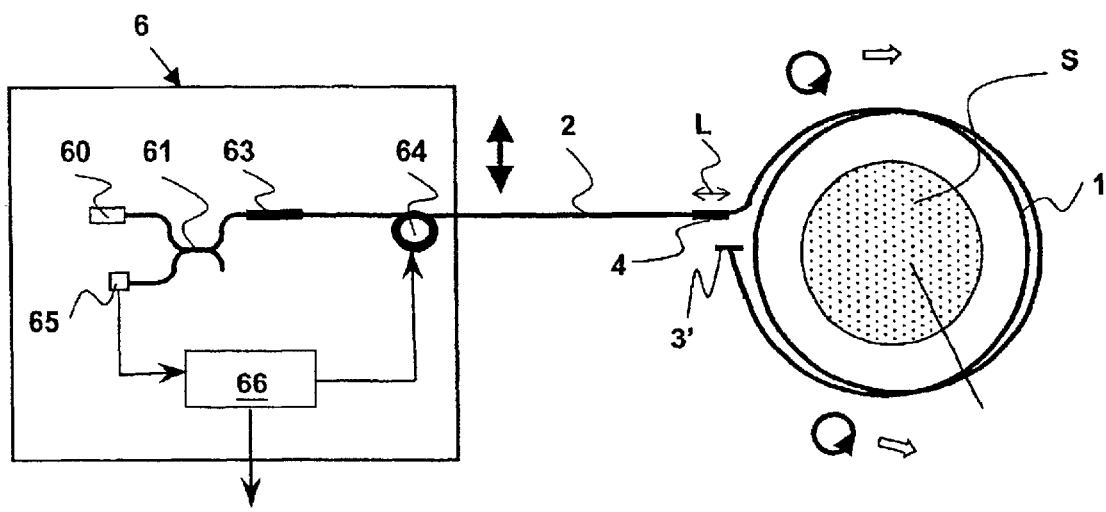
FIG. 4 shows a schematic of a fiber optic current sensor in a reflection configuration.

A fiber optic current sensor with a reflection interferometer is illustrated in FIG. 4. By contrast with the abovedescribed Sagnac interferometer, this current sensor has no return fiber, but an end of a sensor fiber 1 averted from the feed fiber 3 is designed as reflector 3'. As regards the temperature composition, this configuration forms a special case of the current sensor in accordance with FIG. 1. Given a deviation δ in the phase delay φ of the λ/4 segment of 90°, the reflection interferometer behaves like a Sagnac interferometer with two identical λ/4 segments whose axes are aligned parallely. The current-induced differential phase shift is then approximately $$\Delta\Phi'_R \approx \Delta\Phi_R[1+\delta^2/2] \tag{9}$$

$\Delta\Phi_R$ is given by equation (2). If the temperature dependence of the phase delay of the λ/4 segment is −0.0153°/° C., as in the above example, the phase delay angle is to be set to 105° at room temperature, and the length L of the segment is to be selected correspondingly in order to achieve compensation of the temperature dependence of the Verdet's constant V.

The reflection interferometer has the advantage that in conjunction with a known temperature dependence of the λ/4 segment only the phase delay (that is to say the length of the segment) need be selected correctly for a given temperature (in general room temperature) in order to achieve temperature compensation.

List of Reference Symbols

S Current conductor  
L Length of the phase delay element  
A Parallel fast axes  
B Fast axes at 45°  
C Orthogonal fast axes  
TW Temperature dependence of the phase angle  
TV Temperature dependence of the Verdet's constant  
K Temperature-compensated current sensor  
φ Phase delay angle  
1 Sensor fiber  
2 Feed fiber  
3 Return fiber  
3' Reflector  
4 First phase delay element  
5 Second phase delay element  
6 Evaluation module  
60 Laser diode  
61 First fiber coupler  
62 Second fiber coupler  
63 Fiber polarizer  
64 Phase modulator  
65 Photodiode  
66 Signal processor

What is claimed is:

1. A fiber optic current sensor, comprising:
   a coiled sensor fiber which encloses a current conductor; and at least one phase delay element adjoining the sensor fiber;

wherein the sensor fiber has a Verdet's constant V, which Verdet's constant V has a temperature dependence;

wherein the sensitivity of the sensor is describable by a generally temperature-dependent function SK(T);

wherein changes in the function SK(T) owing to the temperature dependence of the Verdet's constant V are describable by a function TV(T);

wherein changes in the function SK(T) owing to the temperature dependence of the at least one phase delay element are describable by a function TW(T);

wherein the phase delay of the at least one phase delay element is chosen such that the function TW(T) is such that the product K(T)=TV(T)·TW(T) is at least approximately temperature independent.

2. The current sensor as claimed in claim 1, wherein the at least one phase delay element has a phase delay angle whose value deviates from a phase delay angle of an ideal phase delay element.

3. The current sensor as claimed in claim 1, wherein the at least one phase delay element is a $\lambda/4$ optical fiber segment with an elliptical core, and wherein the $\lambda/4$ optical fiber segment has a length which deviates from a quarter or an odd multiple of a quarter of a beat length of orthogonal polarization modes.

4. The current sensor as claimed in claim 2, comprising at least two phase delay elements, each having a fast axis, wherein the magnitude of the phase delay angles is selected as a function of a mutual alignment of the fast axes of the phase delay elements.

5. The current sensor as claimed in claim 2, wherein the magnitude of the phase delay angle is selected as a function of a sign of the contribution of the at least one phase delay element to the temperature dependence of the sensitivity of the sensor.

6. The current sensor as claimed in claim 2, comprising at least two phase delay elements, each having a fast axis, the fast axes being orientated at least approximately parallelly to one another, wherein the magnitude of the phase delay angle is selected as a function of a sign of the contribution of the at least one phase delay element to the temperature dependence of the sensitivity of the sensor, wherein in the case of a negative sign of the contribution of the at least one phase delay element to the temperature dependence of the sensitivity of the sensor, the phase delay angle is greater than a phase delay angle of an ideal phase delay element, and in the case of a positive sign of the contribution of the at least one phase delay element to the temperature dependence of the sensitivity of the sensor, the phase delay angle is smaller than a phase delay angle of an ideal phase delay element.

7. The current sensor as claimed in claim 2, comprising at least two phase delay elements, each having a fast axis, the fast axes being orientated at least approximately orthogonally to one another, wherein the magnitude of the phase delay angle is selected as a function of a sign of the contribution of the at least one phase delay element to the temperature dependence of the sensivity of the sensor, wherein in the case of a of negative sign of the contribution of the at least one phase delay element to the temperature dependence of the sensivity of the sensor, the phase delay angle is smaller than a phase delay angle of an ideal phase delay element, and in the case of a of positive sign of the contribution of the at least one phase delay element to the temperature dependence of the sensivity of the sensor, the phase delay angle is greater than a phase delay angle of an ideal phase delay element.

8. The current sensor as claimed in claim 1, the current sensor comprising a Sagnac interferometer.

9. The current sensor as claimed in claim 1, the current sensor comprising a reflection interferometer.

10. A fiber optic current sensor, comprising:

a coiled sensor fiber which encloses a current conductor; and at least one phase delay element adjoining the sensor fiber;

wherein the at least one phase delay element has a phase delay angle whose value deviates from a phase delay angle of an ideal phase delay element; and wherein the phase delay of the at least one phase delay element is chosen such that a contribution of the at least one phase delay element to the temperature dependence of the sensivity of the sensor at least approximately compensates for a contribution of a Verdet's constant of the sensor fiber to the temperature dependence of the sensitivity of the sensor.

11. A fiber optic current sensor, comprising:

a coiled sensor fiber which encloses a current conductor; and at least one phase delay element adjoining the sensor fiber;

wherein the at least one phase delay element is a $\zeta/4$ phase delay element; and wherein the $\lambda/4$ phase delay element has a length which deviates from a quarter or an odd multiple of a quarter of a beat length of orthogonal polarization modes; and wherein the length of the at least one phase delay element is chosen such that a contribution of the at least one phase delay element to the temperature dependence of the sensitivity of the sensor at least approximately compensates for a contribution of a Verdet's constant of the sensor fiber to the temperature dependence of the sensitivity of the sensor.

* * * * *